United States Patent
Luo et al.

(10) Patent No.: US 12,160,962 B2
(45) Date of Patent: Dec. 3, 2024

(54) ELECTRONIC DEVICE

(71) Applicant: VIVO MOBILE COMMUNICATION CO., LTD., Dongguan (CN)

(72) Inventors: Xiandong Luo, Dongguan (CN); Ruhao Lin, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 195 days.

(21) Appl. No.: 17/901,804

(22) Filed: Sep. 1, 2022

(65) Prior Publication Data

US 2022/0418120 A1    Dec. 29, 2022

Related U.S. Application Data

(63) Continuation of application No. PCT/CN2021/074700, filed on Feb. 1, 2021.

(30) Foreign Application Priority Data

Mar. 2, 2020 (CN) .......................... 202010136430.1

(51) Int. Cl.
*H05K 5/00* (2006.01)
*H05K 5/06* (2006.01)

(52) U.S. Cl.
CPC .......... *H05K 5/0018* (2022.08); *H05K 5/0091* (2013.01); *H05K 5/069* (2013.01)

(58) Field of Classification Search
CPC .................................................. H05K 5/0018
See application file for complete search history.

(56) References Cited

U.S. PATENT DOCUMENTS 8,553,419 B2 * 10/2013 Luo ..................... G06K 13/0825
                                                         312/123
9,685,732 B2 *  6/2017 Eromäki ................. G06F 1/181
10,211,561 B2 *  2/2019 Lu ......................... H01R 13/502

FOREIGN PATENT DOCUMENTS

| CN | 105187700 A | 12/2015 |
| CN | 108055426 A | 5/2018 |
| CN | 109218480 A | 1/2019 |
| CN | 109379530 A | 2/2019 |
| CN | 110536578 A | 12/2019 |
| CN | 110557470 A | 12/2019 |
| CN | 209748616 U | 12/2019 |

(Continued)

OTHER PUBLICATIONS

WO-2019228324-A1 English translation (Year: 2019).*

(Continued)

*Primary Examiner* — Mukundbhai G Patel
(74) *Attorney, Agent, or Firm* — IPX PLLC

(57) ABSTRACT

An electronic device is provided. The electronic device includes a device body provided with an accommodation space and an opening communicated with the accommodation space, a function module having a first state and a second state, and an ejecting mechanism including a connecting rod, a slider detachably connected to the function module, a driving member, and a guide rail that is disposed on the slider. The driving member is disposed in the accommodation space, a first end of the connecting rod is hinged to the device body, a second end of the connecting rod slides along the guide rail, and the slider is configured to switch between a first position and a second position.

14 Claims, 9 Drawing Sheets

(56) References Cited

FOREIGN PATENT DOCUMENTS

CN  111405086 A  7/2020
WO  WO-2019228324 A1 * 12/2019  .............. H04M 1/02

OTHER PUBLICATIONS

International Search Report issued in corresponding International Application No. PCT/CN2021/074700, mailed Apr. 26, 2021, 4 pages.
First Office Action issued in related Chinese Application No. 202010136430.1, mailed Nov. 4, 2020, 8 pages.
Second Office Action issued in related Chinese Application No. 202010136430.1, mailed May 27, 2021, 9 pages.

* cited by examiner

US 12,160,962 B2

ELECTRONIC DEVICE

CROSS-REFERENCE

This application is a continuation of International Application No. PCT/CN2021/074700, filed Feb. 1, 2021, which claims priority to Chinese Patent Application No. 202010136430.1, filed Mar. 2, 2020. The entire contents of each of the above-referenced applications are expressly incorporated herein by reference.

TECHNICAL FIELD

The present disclosure relates to the field of communications device technologies, and in particular, to an electronic device.

BACKGROUND

With advances in technology and the development of electronic devices, a requirement of a user on a screen-to-body ratio of an electronic device gradually increases, and increasing the screen-to-body ratio of the electronic device gradually becomes a development trend. To implement a relatively large screen-to-body ratio of the electronic device, some function modules need to be inserted into the electronic device. When the function module needs to work, a driving mechanism may be used to drive the function module to be protruded out of a housing of the electronic device to work. The function module in this structure does not occupy a panel space of the electronic device, so that the screen-to-body ratio can be increased.

Currently, the function module of an electronic device can only work in a protruding position, and therefore flexibility is relatively poor.

SUMMARY

The present disclosure discloses an electronic device.

An electronic device is provided, including: a device body, where the device body is provided with an accommodation space and an opening communicated with the accommodation space; a function module, where the function module has a first state and a second state; and an ejecting mechanism, where the ejecting mechanism includes a connecting rod, a slider, and a driving member, the function module is detachably connected to the slider, a guide rail is disposed on the slider, and the guide rail includes a first limiting segment, a protruding segment, a second limiting segment, and a retraction segment connected in sequence, where the driving member is disposed in the accommodation space, the driving member may drive the slider to move in a direction perpendicular to the opening, a first end of the connecting rod is hinged to the device body, and a second end of the connecting rod slides along the guide rail. In a case that the function module is in the first state, the function module is separated from the slider; in a case that the function module is in the second state, the function module is connected to the slider, and the slider may be switched between a first position and a second position. In a case that the slider is in the first position, the function module is at least partially outside the accommodation space, and the second end of the connecting rod is fitted with the first limiting segment, to restrict the slider to moving toward the opening; and in a case that the slider is in the second position, the function module is in the accommodation space, and the second end of the connecting rod is fitted with the second limiting segment, to restrict the slider to moving toward the opening.

The technical solution used in the present disclosure can achieve the following beneficial effects:

According to the electronic device disclosed in the embodiments of the present disclosure, a function module is detachably connected to a slider, and the function module can be protruded out of or retracted into an accommodation space through the slider. Compared with a case that the function module of the existing electronic device needs to be connected to components such as a driving motor or a reducer to implement movement, in the embodiments disclosed in the present disclosure, the function module can also be separated from the slider, so that the function module can not only work outside the accommodation space, but can also work in a case that the function module is separated from a device body, thereby improving flexibility of the function module. In addition, the slider is switched between a protruding position and a retraction position by using a connecting rod and a driving member. In this way, a user can install and remove the function module only by pressing the function module, thereby facilitating driving of the function module.

BRIEF DESCRIPTION OF DRAWINGS

The accompanying drawings described herein are intended to provide a further understanding of the present disclosure, and constitute a part of the present disclosure. The illustrative embodiments of the present disclosure and descriptions thereof are intended to describe the present disclosure, and do not constitute limitations on the present disclosure. In the accompanying drawings.

DESCRIPTION OF REFERENCE NUMERALS

Figure 1:
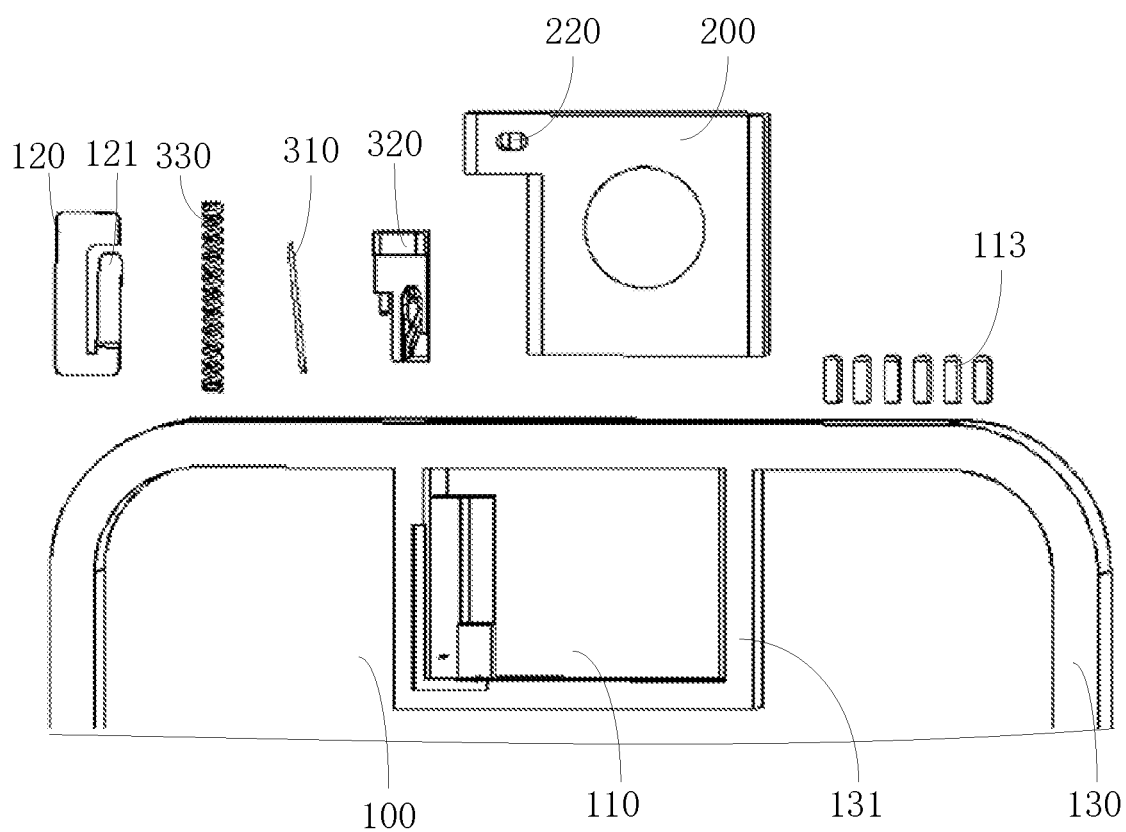
FIG. 1 is an exploded view of an electronic device according to an embodiment of the present disclosure.
Figure 2:
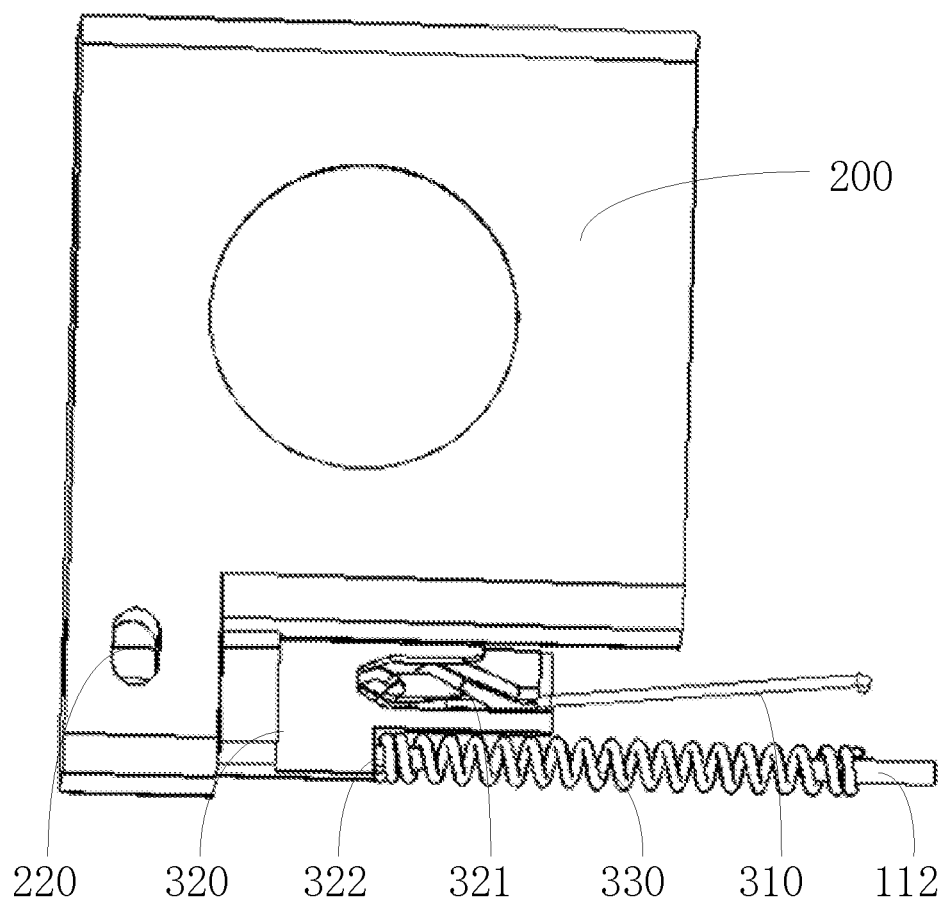
FIG. 2 is a schematic diagram of a partial structure of an electronic device according to an embodiment of the present disclosure.
Figure 3:
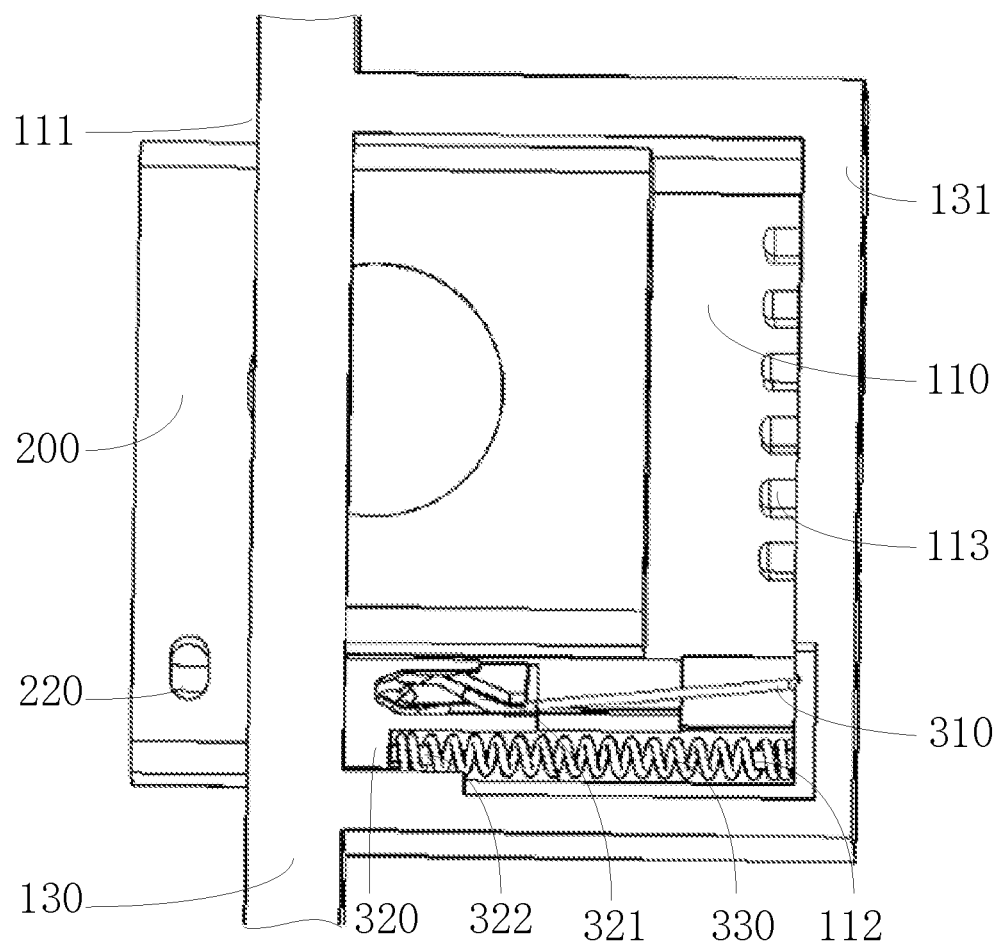
FIG. 3 is a schematic diagram of a partial structure when a slider in an electronic device in a first position according to an embodiment of the present disclosure.
Figure 4:
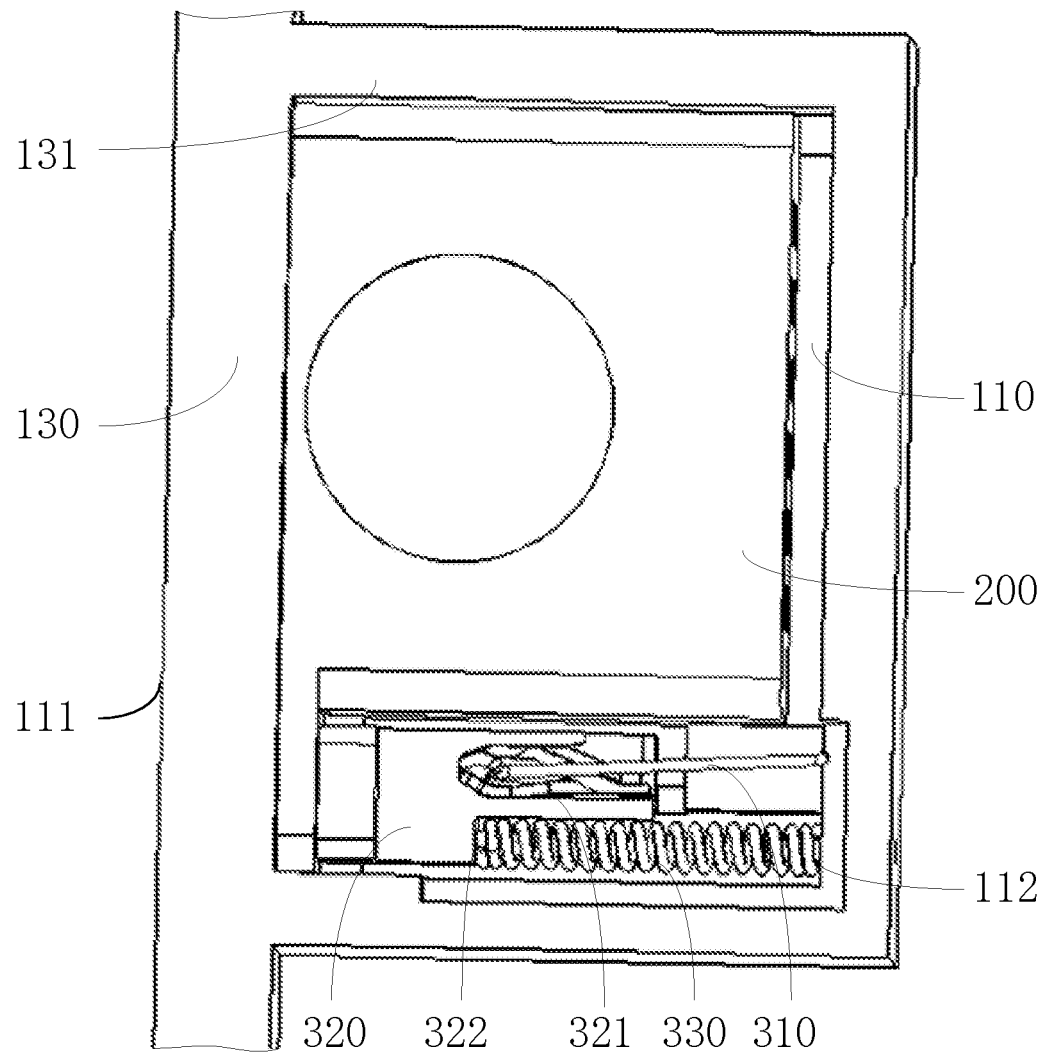
FIG. 4 is a schematic diagram of a partial structure when a slider in an electronic device in a second position according to an embodiment of the present disclosure.
Figure 5:
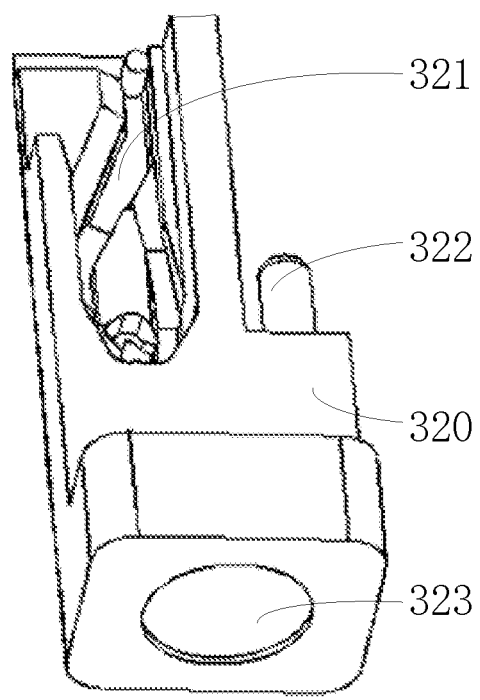
FIG. 5 and FIG. 6 are respectively schematic structural diagrams of a slider in different perspectives according to an embodiment of the present disclosure.

100—device body, 110—accommodation space, 111—opening, 112—first guide post, 113—plug protrusion, 120—first housing, 121—elastic arm, 130—second housing, and 131—isolating member;

200—function module, 210—magnetic member, 220—rope hole, and 230—plug groove;

310—connecting rod, 320—slider, 321—guide rail, 321*a*—first limiting segment, 321*b*—protruding segment, 321*c*—second limiting segment, 321*d*—retraction segment, 321*e*—first annular protrusion, 321*f*— second annular protrusion, 322—second guide post, 323—magnetically-attracting member, and 330—driving member.

DETAILED DESCRIPTION

To make the objectives, technical solutions, and advantages of the present disclosure clearer, the following clearly describes the technical solutions of the present disclosure with reference to the specific embodiments and the corresponding accompanying drawings in the present disclosure. Apparently, the described embodiments are some rather than all of the embodiments of the present disclosure. All other embodiments obtained by a person of ordinary skill in the art based on the embodiments of the present disclosure without creative efforts shall fall within the protection scope of the present disclosure.

The following describes in detail the technical solutions disclosed in the embodiments of the present disclosure with reference to the accompanying drawings.

As shown in FIG. 1 to FIG. 9, an embodiment of the present disclosure discloses an electronic device, and the disclosed electronic device includes a device body 100, a function module 200, and an ejecting mechanism.

The device body 100 is provided with an accommodation space 110, and the accommodation space 110 can provide installation positions for the function module 200 and the ejecting mechanism. The device body 100 is further provided with an opening 111 communicated with the accommodation space 110, and the function module 200 can be protruded out of or retracted into the accommodation space 110 through the opening 111. The opening 111 may be disposed in a second housing 130 of the device body 100. In some embodiments, the opening 111 may be disposed in a middle frame of the second housing 130. In some embodiments, the opening 111 may also be disposed in another position of the second housing 130. A specific disposing position of the opening 111 is not limited in the present disclosure.

The function module 200 may include at least one of a camera, a fill light module, a fingerprint recognition module, a microphone, an electrical connection interface, a data card, or a telephone receiver. In some embodiments, the function module 200 may be another type of function module. A specific type of the function module 200 is not limited in this embodiment of the present disclosure.

The ejecting mechanism includes a connecting rod 310, a slider 320, and a driving member 330, the function module 200 is detachably connected to the slider 320, a guide rail 321 is disposed on the slider 320, and the guide rail 321 includes a first limiting segment 321a, a protruding segment 321b, a second limiting segment 321c, and a retraction segment 321d connected in sequence. Both the protruding segment 321b and the retraction segment 321d are connected to the first limiting segment 321a and the second limiting segment 321c. In some embodiments, one end of the first limiting segment 321a opposite to the second limiting segment 321c is connected by using the protruding segment 321b, and the other end of the first limiting segment 321a opposite to the second limiting segment 321c is connected by using the retraction segment 321d.

The driving member 330 is disposed in the accommodation space 110, and the driving member 330 may drive the slider 320 to move in a direction perpendicular to the opening 111, so that the slider 320 can drive the function module 200 to be at least partially protruded out of the accommodation space 110 through the opening 111. In some embodiments, when the function module 200 is connected to the slider 320, the driving member 330 may drive the slider 320 to move to enable the function module 200 to be at least partially protruded out of the accommodation space 110 through the opening 111. The driving member 330 may be a spiral telescopic spring, or may be an elastic rubber member. A specific type of the driving member 330 is not limited in this embodiment of the present disclosure.

A first end of the connecting rod 310 is hinged to the device body 100, and a second end of the connecting rod 310 slides along the guide rail 321, so that the second end of the connecting rod 310 slides into each part of the guide rail 321 during moving of the slider 320. In some embodiments, the first end of the connecting rod 310 is rotated, so that an adaptive sliding fit can be performed with the first limiting segment 321a, the protruding segment 321b, the second limiting segment 321c, and the retraction segment 321d. The second end of the connecting rod 310 is fitted with the first limiting segment 321a, and the second end of the connecting rod 310 is fitted with the second limiting segment 321c, so that the slider 320 can be maintained in a specified position. In this case, when the slider 320 is connected to the function module 200, the function module 200 can be maintained in the protruding position and the retraction position described above through the slider 320.

In some embodiments, the first limiting segment 321a may include a first sub-limiting segment and a second sub-limiting segment, the first sub-limiting segment and the second sub-limiting segment are disposed at intervals, the second limiting segment 321c may be a polyline limiting segment, one end of the first sub-limiting segment is connected to a first end of the polyline limiting segment through the protruding segment 321b, and one end of the second sub-limiting segment is connected to a second end of the polyline limiting segment through the retraction segment 321d.

Further, in an implementation, the protruding segment 321b may be disposed opposite and inclined to the retraction segment 321d, and a spacing between one end that is of the protruding segment 321b and that is close to the first sub-limiting segment and one end that is of the retraction segment 321d and that is close to the second sub-limiting segment is a first spacing, and a spacing between one end that is of the protruding segment 321b and that is close to the polyline limiting segment and one end that is of the retraction segment 321d and that is close to the polyline limiting segment is a second spacing, where the first spacing is less than the second spacing, so that the guide rail 321 may be partially in an "M" structure. In this embodiment of the present disclosure, the protruding segment 321b and the retraction segment 321d are inclined, so that a better guide action can be carried out on the second end of the connecting rod 310. In this way, when the second end of the connecting rod 310 moves between the first limiting segment 321a and the second limiting segment 321c, resistance is less, and sliding is smoother, thereby avoiding a stutter phenomenon during moving of the second end of the connecting rod 310.

Figure 6:
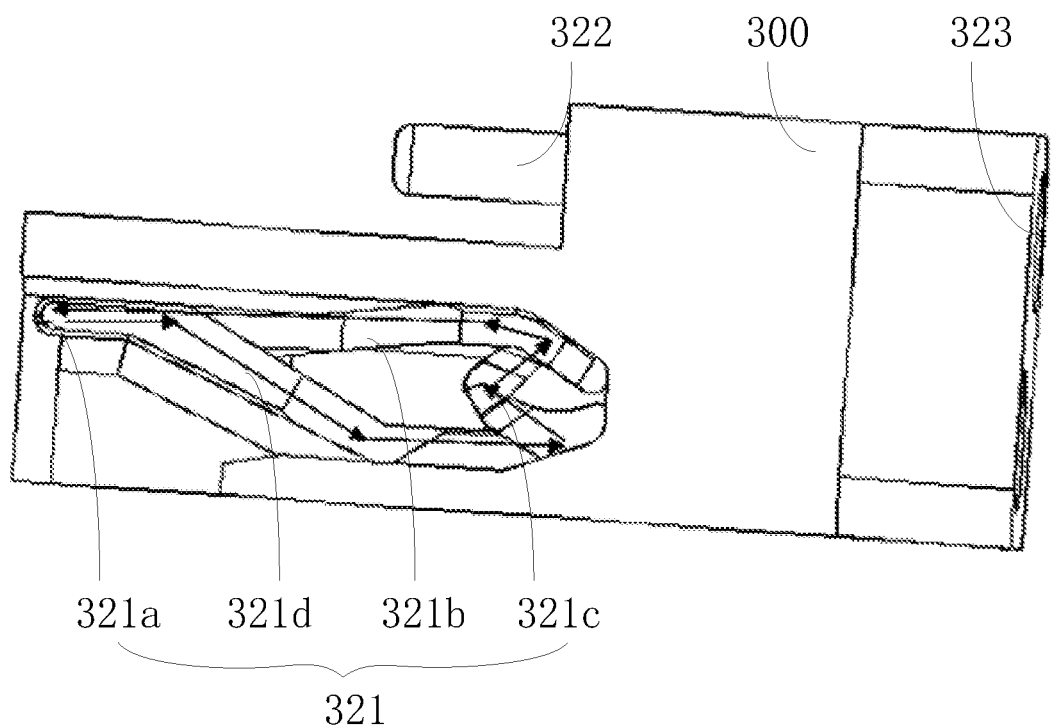
Figure 7:
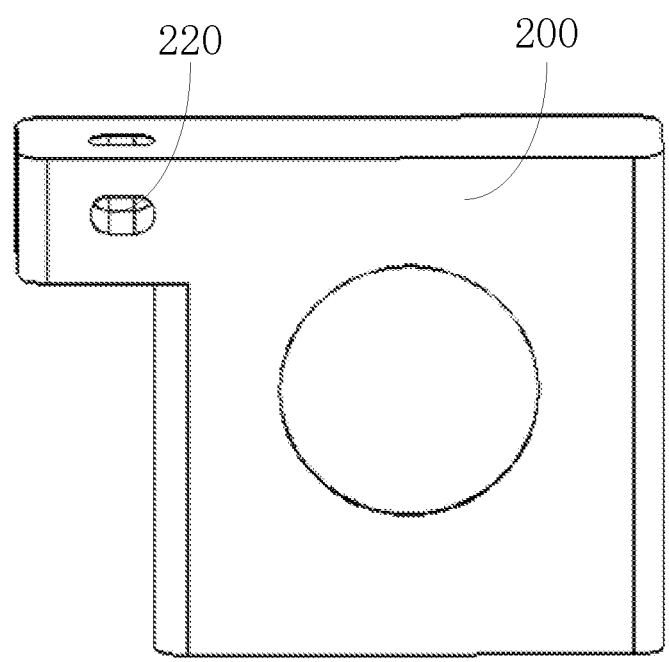
FIG. 7 and FIG. 8 are respectively schematic structural diagrams of a function module in different perspectives according to an embodiment of the present disclosure.
Figure 8:
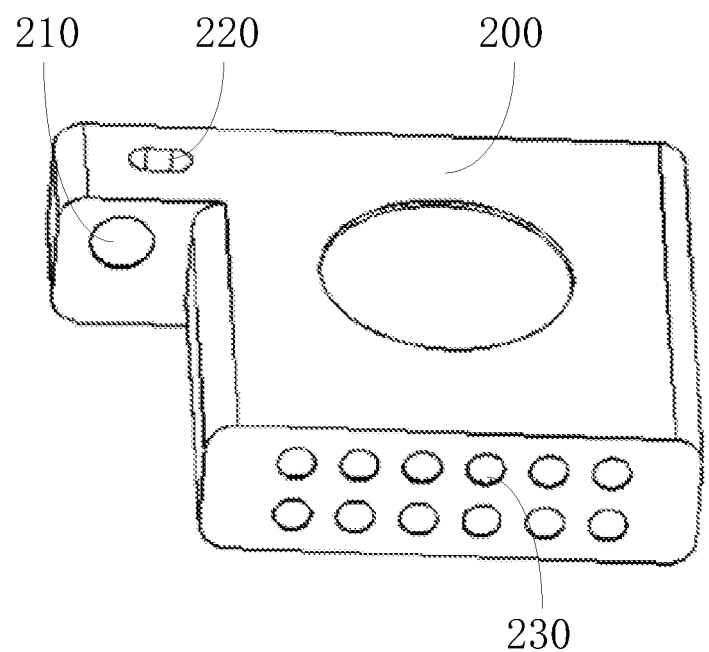
Figure 9:
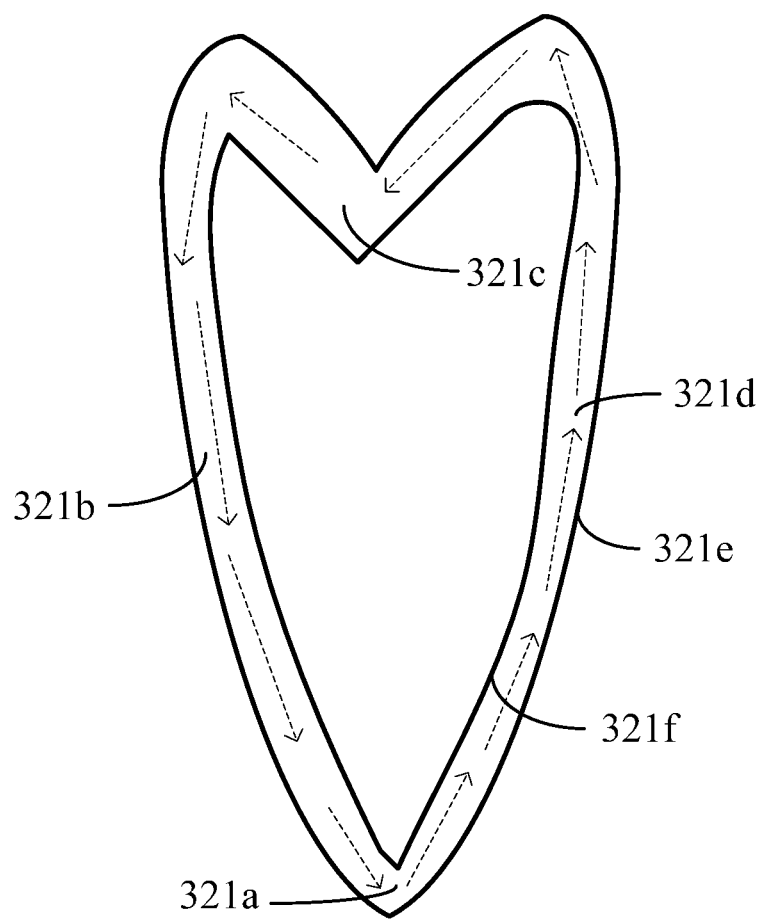
FIG. 9 is a schematic structural diagram of another guide rail according to an embodiment of the present disclosure.

As shown in FIG. 6, the guide rail 321 may be an annular rail. In some embodiments, a first end of the first limiting segment 321a is connected to the protruding segment 321b, a second end of the first limiting segment 321a is connected to the retraction segment 321d, a first end of the second limiting segment 321c is connected to the protruding segment 321b, and a second end of the second limiting segment 321c is connected to the retraction segment 321d. In this case, when the slider 320 is connected to the function module 200, in a case that the function module 200 is continuously pressed by a user, the second end of the connecting rod 310 can slide relative to the guide rail 321. Referring to FIG. 6 again (an arrow in the figure indicates a moving direction of the second end of the connecting rod 310), the second end of the connecting rod 310 can enter from the first limiting segment 321a to the retraction segment 321d, from the retraction segment 321d to the second limiting segment 321c, from the second limiting segment 321c to the protruding segment 321b, and from the protruding segment 321b to the first limiting segment 321a, and circulates in sequence with pressing. The protruding segment 321b and the retraction segment 321d play a guide role, so that the second end of the connecting rod 310 can be switched and fitted between the first limiting segment 321a and the second limiting segment 321c, and movement of the second end of the connecting rod 310 is smoother.

In this embodiment of the present disclosure, the function module 200 has a first state and a second state. In a case that the function module 200 is in the first state, the function module 200 is separated from the slider 320. In this case, the function module 200 may be separated from the device body 100, so that the function module 200 can work away from the device body 100.

In a case that the function module 200 is in the second state, the function module 200 is connected to the slider 320, and the slider 320 may be switched between a first position and a second position.

In some embodiments, in a case that the slider 320 is in the first position, the function module 200 is at least partially outside the accommodation space 110, and the second end of the connecting rod 310 is fitted with the first limiting segment 321a, to restrict the slider 320 moving in a direction of the opening 111, and the fit between the second end of the connecting rod 310 and the first limiting segment 321a can enable the slider 320 to be maintained in the first position. In a case that the slider 320 is in the second position, the function module 200 is in the accommodation space 110, and the second end of the connecting rod 310 is fitted with the second limiting segment 321c, to restrict the slider 320 moving in a direction of the opening 111, and the fit between the second end of the connecting rod 310 and the second limiting segment 321c can enable the slider 320 to be maintained in the second position. An action force generated by the second end of the connecting rod 310 against the slider 320 is opposite to an action force generated by the driving member 330 against the slider 320, so that the slider 320 is maintained at a corresponding position, and further, the function module 200 is maintained at a corresponding position.

During use, after the function module 200 completes work, the user may manually press the function module 200. Further, the function module 200 enables the slider 320 to overcome an action force of the driving member 330. The second end of the connecting rod 310 may slide, through the retraction segment 321d, from the first limiting segment 321a to a position that fits with the second limiting segment 321c. The slider 320 may be in the second position so that the function module 200 is in the accommodation space 110, and the function module 200 can be maintained in a retraction position under the action force of the driving member 330 and the fit of the second limiting segment 321c. When the function module 200 needs to work, the user may press the function module 200 again so that the slider 320 overcomes the action force of the driving member 330. The second end of the connecting rod 310 may slide, through the protruding segment 321b, from the second limiting segment 321c to a position that fits with the first limiting segment 321a. At the same time, the slider 320 drives the function module 200 so that the function module 200 is at least partially protruded out of the accommodation space 110 through the opening 111, and the slider 320 can be maintained in the first position under the action force of the driving member 330 and the fit of the second limiting segment 321c. In this case, the function module 200 may be maintained in a protruding position, and the function module 200 may also be separated from the slider 320, so that the function module 200 can work away from the device body 100.

It can be learned from the foregoing working process that in the electronic device disclosed in this embodiment of the present disclosure, a function module 200 is detachably connected to a slider 320, and the function module 200 can be protruded out of or retracted into an accommodation space 110 through the slider 320. Compared with a case that the function module 200 of the existing electronic device needs to be connected to components such as a driving motor or a reducer to implement movement, in this embodiment disclosed in the present disclosure, the function module 200 can also be separated from the slider 320, so that the function module 200 can not only work outside the accommodation space 110, but can also work in a case that the function module 200 is separated from a device body 100, thereby improving flexibility of the function module 200. In addition, the slider 320 is switched between a protruding position and a retraction position by using a connecting rod 310 and a driving member 330. In this way, a user can install and remove the function module 200 only by pressing the function module 200, thereby facilitating driving of the function module 200.

In addition, the foregoing ejecting mechanism is a manual driving mechanism, so that the function module 200 can enter or exit the accommodation space without consuming power, thereby reducing energy consumption of the entire electronic device.

In this embodiment of the present disclosure, the driving member 330 may be an elastic member, one end of the elastic member may be located on an inner wall of the accommodation space 110, and the other end of the elastic member may be located on the slider 320. Compared with the driving member 330 of another structure, the elastic member has a relatively large elastic deformation capability, so that the slider 320 can be easily driven. In addition, when the driving member 330 is an elastic member, a service life of the driving member 330 can be further prolonged. The elastic member may be a telescopic spring. In some embodiments, the elastic member may be another elastic component. A specific structure of the elastic member is not limited in the present disclosure.

In an actual assembling process, two ends of the elastic member may be separately in contact with the inner wall of the accommodation space 110 and the slider 320. In some embodiments, to improve assembly performance, a first guide post 112 may be disposed on the inner wall of the accommodation space 110, a second guide post 322 may be disposed on the slider 320, one end of the elastic member may be sleeved on the first guide post 112, and the other end of the elastic member may be sleeved on the second guide post 322, thereby facilitating installation and removal of the elastic member.

In some embodiments, there may be a plurality of manners in which the driving member 330 drives the slider 320 to move. For example, the driving member 330 may include a first magnetic member and a second magnetic member. The first magnetic member may be disposed in the accommodation space 110, the second magnetic member may be connected to the slider 320, the first magnetic member is disposed opposite to the second magnetic member, and magnetism of the first magnetic member is the same as that of the second magnetic member. In this case, because the first magnetic member and the second magnetic member that have the same magnetism repel each other, the second magnetic member generates an action force in a direction toward the opening 111 by means of repelling of the first magnetic member, so that the slider 320 indirectly has the action force in the direction toward the opening 111, and finally the slider 320 can be driven.

In this embodiment disclosed in the present disclosure, the second end of the connecting rod 310 plays a role of maintaining a position of the slider 320, and the second end of the connecting rod 310 may have a plurality of specific structures. In an embodiment, the second end of the connecting rod 310 may be a hook, and the hook is separately hitched to the first limiting segment 321a and the second limiting segment 321c, to implement a separate limiting fit with the first limiting segment 321a and the second limiting segment 321c. In some embodiments, in a case that the function module 200 is at least partially outside the accommodation space 110, the hook is hitched to the first limiting segment 321a, and in this case, the slider 320 is in the first position. In a case that the function module 200 is in the accommodation space 110, the hook is hitched to the second limiting segment 321c, and in this case, the slider 320 is in the second position. In this case, the second end of the connecting rod 310 is disposed between the opening 111 and the first end of the connecting rod 310, and the connecting rod 310 exerts a pulling force on the slider 320, to restrict the slider 320 moving in a protruding direction of the function module 200, so that the slider 320 can be maintained in the first position or the second position. Both the first limiting segment 321a and the second limiting segment 321c may be concave, thereby facilitating limiting hitch to the hook.

In the foregoing embodiment, the first end of the connecting rod 310 is located on one side that is of the slider 320 and that is away from to the opening 111, so that the entire connecting rod 310 is closer to a central area of the device body 100. Because a circuit board and a relatively large quantity of electronic components are disposed in the central area of the device body 100, the connecting rod 310 is prone to interference with the circuit board or the electronic component. For this reason, in another embodiment, the second end of the connecting rod 310 may be an abutting portion that abuts against the first limiting segment 321a and the second limiting segment 321c. In some embodiments, in a case that the function module 200 is at least partially outside the accommodation space 110, the abutting portion abuts against the second limiting segment 321c, and in this case, the slider 320 is in the first position. In a case that the function module 200 is in the accommodation space 110, the abutting portion abuts against the first limiting segment 321a, and in this case, the slider 320 is in the second position. In this case, the first end of the connecting rod 310 is located between the opening 111 and the second end of the connecting rod 310, and an action force exerted by the abutting portion on the slider 320 may be a thrust force. Similarly, both the first limiting segment 321a and the second limiting segment 321c may be concave, thereby facilitating limiting abutment with the abutting portion. The first limiting segment 321a and the second limiting segment 321c may further be other structures, provided that the first limiting segment 321a and the second limiting segment 321c can implement a limiting fit with the abutting portion, so that the slider 320 is maintained in the first position or the second position under restriction of the abutting portion.

It can be learned from the foregoing that in this manner, the first end of the connecting rod 310 is located on one side that is of the slider 320 and that faces the opening 111, so that the connecting rod 310 is closer to an edge of the device body 100. Because fewer electronic components are distributed on the edge of the device body 100, interference between the connecting rod 310 and the electronic component in the device body 100 can be prevented.

In this embodiment of the present disclosure, the first limiting segment 321a, the protruding segment 321b, the second limiting segment 321c, and the retraction segment 321d may be groove segments of a plurality of structures. Referring to FIG. 6, the protruding segment 321b may be a straight groove segment, so that the function module 200 can be more quickly protruded. In an exemplary solution, the retraction segment 321d may include an arc groove segment. During retraction of the function module 200, the user needs to press the function module 200 for a longer time. Because the arc groove segment has a certain curvature, the second end of the connecting rod 310 can be directed to a position that fits the first limiting segment 321a.

The guide rail 321 may also be of another structure, and is not limited to a groove structure. In a specific implementation, the guide rail 321 may be a protrusion guide portion. In some embodiments, referring to FIG. 9, the protrusion guide portion may include a first annular protrusion 321e and a second annular protrusion 321f, and an area between the first annular protrusion 321e and the second annular protrusion 321f is the guide rail 321. In this case, each of the first limiting segment 321a, the protruding segment 321b, the second limiting segment 321c, and the retraction segment 321d may be at least a part of the area between the first annular protrusion 321e and the second annular protrusion 321f. In a working process, a slide formation of the second end of the connecting rod 310 may be shown in FIG. 9, and a direction in which the second end of the connecting rod 310 slides relative to the guide rail 321 is shown by a dotted arrow in FIG. 9. In this manner, the sliding of the second end of the connecting rod 310 is smoother, thereby avoiding a stutter phenomenon during moving of the second end of the connecting rod 310. In some embodiments, the first annular protrusion 321e and the second annular protrusion 321f may be formed through injection molding, and may be formed in another manner. A specific molding manner of the first annular protrusion 321e and the second annular protrusion 321f is not limited in the present disclosure.

In addition, in this embodiment of the present disclosure, the function module 200 needs to be detachably connected to the slider 320, so that the function module 200 can be switched between the first state and the second state. Based on this, the function module 200 and the slider 320 may be detachably connected in a plurality of manners. For example, the function module 200 may be connected to the slider 320 through magnetic attraction, so that the function module 200 can implement the foregoing state. In some embodiments, the function module 200 may be connected to the slider 320 through magnetic attraction in a plurality of manners. In a solution, a magnetic member 210 may be disposed on the function module 200, the magnetic member 210 may be an electromagnet, and a magnetically-attracting member 323 may be disposed on the slider 320. In a case that the slider 320 is in the second position, the function module 200 is electrically connected to the device body 100, so that the magnetic member 210 is electrified to generate a magnetic force, and therefore the magnetic member 210 is connected to the magnetically-attracting member 323 through magnetic attraction, and finally the function module 200 can be maintained in the accommodation space 110. In addition, in this case, in a case that the slider 320 is in another position, the magnetic member 210 is not electrified, so that the function module 200 is in contact with only the slider 320, and therefore the slider 320 can be easily removed from the accommodation space 110.

In this embodiment of the present disclosure, during moving of the slider 320, the second end of the connecting rod 310 may be separated from the guide rail 321. To implement more stable sliding fit, the device body 100 may include a first housing 120, the first housing 120 may be provided with a slide cavity, the slider 320 may be at least partially located in the slide cavity, and the connecting rod 310 may be at least partially located in the slide cavity. In this case, the second end of the connecting rod 310 may slide in the slide cavity, thereby preventing the second end of the connecting rod 310 from being separated from the guide rail 321, and improving slide stability of the second end of the connecting rod 310.

In addition, to enable the second end of the connecting rod 310 to slide better in the guide rail 321, the first housing 120 may include an elastic arm 121, and the connecting rod 310 may be at least partially located between the elastic arm 121 and the guide rail 321. In this case, because of an elastic action of the elastic arm 121, the second end of the connecting rod 310 can better slide in the guide rail 321, thereby preventing the second end of the connecting rod 310 from being separated from the guide rail 321.

After the foregoing structure is used, the connecting rod 310 may at least partially slide between the elastic arm 121 and the guide rail 321. Based on this, in an exemplary solution, the elastic performance of the elastic arm 121 may be used, so that the second end of the connecting rod 310 can be abutted against the guide rail 321, thereby preventing the second end of the connecting rod 310 from swinging between the elastic arm 121 and the guide rail 321, and better preventing the second end of the connecting rod 310 from being separated from the guide rail 321.

In the electronic device disclosed in this embodiment of the present disclosure, the function module 200 may be separated from the device body 100, and the device body 100 may remotely control the function module 200 to work. In a case that the function module 200 is separated from the device body 100, the accommodation space 110 is in contact with an external environment, and is not conducive to a waterproof and dust-proof effect of the electronic device. Therefore, in an exemplary, the device body 100 may include a second housing 130, and the second housing 130 may include an isolating member 131. In some embodiments, the second housing 130 may be provided with an inner cavity, and the isolating member 131 may be disposed in the inner cavity. The isolating member 131 isolates the inner cavity of the second housing 130 into a first sub-cavity and a second sub-cavity, the first sub-cavity may be sealed and isolated from the second sub-cavity, and the first sub-cavity may be the foregoing accommodation space 110. In this manner, impurity can be prevented from entering an internal space of the device body 100 through the accommodation space 110, to provide a better waterproof and dust-proof effect.

In addition, a volume of the function module 200 is generally relatively small. When the function module 200 is separated from the device body 100, the function module 200 is prone to be lost. Therefore, the function module 200 may include a function module body and a rope, the function module body may be provided with a rope hole 220, and the rope may be removably connected to the function module body through the rope hole 220. In this case, when the function module body is separated from the device body 100, the user may carry the function module body by using the rope, thereby preventing a loss of the function module body.

In this embodiment of the present disclosure, a plug groove 230 may be disposed in one of the function modules 200 or the accommodation space 110, a plug protrusion 113 may be disposed in the other of the function module 200 or the accommodation space 110, and the plug groove 230 is fitted with the plug protrusion 113. In this case, the function module 200 and the device body 100 may be electrically connected through a plug fit of the plug protrusion 113 and the plug groove 230, so that the function module 200 performs data transmission, charging, and the like. In addition, electrical connection is implemented in this manner, so that the foregoing magnetic member 210 is connected to the magnetically-attracting member 323 through magnetic attraction, and the function module 200 can be stably located in the accommodation space 110.

In this embodiment disclosed in the present disclosure, to enable the function module 200 to be stably driven, there may be two ejecting mechanisms and two driving members 330, and the two ejecting mechanisms and the two driving members 330 may be symmetrically disposed on both sides of the function module 200. In this case, the two ejecting mechanisms and the two driving members 330 that are symmetrically disposed on both sides of the function module 200 may drive the function module 200 to be at last partially stably protruded out of the accommodation space 110 through the opening 111, thereby preventing a phenomenon that the function module 200 is jammed due to an uneven force of the function module 200.

The electronic device disclosed in this embodiment of the present disclosure may be a device such as a smartphone, a tablet computer, an e-book reader, a wearable device (for example, a smart watch), or an electronic game machine. A specific type of the electronic device is not limited in this embodiment of the present disclosure.

The foregoing embodiments of the present disclosure focus on describing differences between the embodiments, and different optimization features of the embodiments may be combined to form better embodiments provided that they are not contradictory. For brevity, details are not described herein again.

The foregoing descriptions are merely the embodiments of the present disclosure, and are not intended to limit the present disclosure. For a person skilled in the art, various variations and changes may be made in the present disclosure. Any modification, equivalent replacement, or improvement made without departing from the spirit and principle of the present disclosure shall fall within the scope of the claims in the present disclosure.

What is claimed is:
1. An electronic device, comprising:
a device body provided with an accommodation space, an opening communicated with the accommodation space, and a first housing having a slide cavity;
a function module having a first state and a second state; and
an ejecting mechanism, comprising a connecting rod, a slider detachably connected to the function module, a driving member, and a guide rail that is disposed on the slider, and comprises a first limiting segment, a pro- truding segment, a second limiting segment, and a retraction segment connected in sequence, wherein:

the driving member is disposed in the accommodation space and is configured to drive the slider to move in a direction perpendicular to the opening, the slider is at least partially located in the slide cavity, the connecting rod is at least partially located in the slide cavity, a first end of the connecting rod is hinged to the device body, and a second end of the connecting rod slides along the guide rail;

when the function module is in the first state, the function module is separated from the slider;

when the function module is in the second state, the function module is connected to the slider, and the slider is configured to switch between a first position and a second position;

when the slider is in the first position, the function module is at least partially outside the accommodation space, and the second end of the connecting rod is fitted with the first limiting segment; and when the slider is in the second position, the function module is in the accommodation space, and the second end of the connecting rod is fitted with the second limiting segment.

2. The electronic device according to claim 1, wherein the driving member is an elastic member, one end of the elastic member is located on an inner wall of the accommodation space, and other end of the elastic member is located on the slider.

3. The electronic device according to claim 2, further comprising a first guide post disposed on the inner wall of the accommodation space, a second guide post disposed on the slider, wherein one end of the elastic member is sleeved on the first guide post, and the other end of the elastic member is sleeved on the second guide post.

4. The electronic device according to claim 1, wherein the driving member comprises a first magnetic member and a second magnetic member, the first magnetic member is disposed in the accommodation space, the second magnetic member is connected to the slider, the first magnetic member is disposed opposite to the second magnetic member, and magnetism of the first magnetic member is the same as that of the second magnetic member.

5. The electronic device according to claim 1, wherein the second end of the connecting rod is a hook, and the hook is hitched to the guide rail.

6. The electronic device according to claim 1, wherein the second end of the connecting rod is an abutting portion, and the abutting portion abuts against the guide rail.

7. The electronic device according to claim 1, further comprising a magnetic member disposed on the function module and a magnetically-attracting member disposed on the slider, wherein when the slider is in the second position, the function module is electrically connected to the device body, so that the magnetic member is connected to the magnetically-attracting member through magnetic attraction.

8. The electronic device according to claim 1, wherein the first housing comprises an elastic arm, and the connecting rod is at least partially located between the elastic arm and the guide rail.

9. The electronic device according to claim 1, wherein the device body comprises a second housing, the second housing comprises an internal cavity and an isolating member, the isolating member is disposed in the internal cavity and isolates the internal cavity into a first sub-cavity and a second sub-cavity, the first sub-cavity is sealed and isolated from the second sub-cavity, and the first sub-cavity is the accommodation space.

10. The electronic device according to claim 1, wherein the function module comprises a function module body and a rope, the function module body is provided with a rope hole, and the rope is removably connected to the function module body through the rope hole.

11. The electronic device according to claim 1, further comprising a plug groove disposed in one of the function modules or the accommodation space and a plug protrusion disposed in the other of the function module or the accommodation space, wherein the plug groove is fitted with the plug protrusion.

12. The electronic device according to claim 1, wherein the ejecting mechanism comprises two ejecting mechanisms, and the two ejecting mechanisms are symmetrically disposed on two sides of the function module.

13. The electronic device according to claim 1, wherein the guide rail is an annular rail, a first end of the first limiting segment is connected to the protruding segment, a second end of the first limiting segment is connected to the retraction segment, a first end of the second limiting segment is connected to the protruding segment, and a second end of the second limiting segment is connected to the retraction segment.

14. The electronic device according to claim 1, wherein the function module comprises at least one of a camera, a fill light module, a fingerprint recognition module, a microphone, an electrical connection interface, a data card, or a telephone receiver.

* * * * *